United States Patent [19]

Tatsumi

[11] Patent Number: 5,211,790
[45] Date of Patent: May 18, 1993

[54] DRY ETCHING METHOD BY SULFUR CONDITIONING

[75] Inventor: Tetsuya Tatsumi, Kanagawa, Japan

[73] Assignee: Sony Corporation, Tokyo, Japan

[21] Appl. No.: 841,946

[22] Filed: Feb. 26, 1992

[30] Foreign Application Priority Data

Feb. 26, 1991 [JP] Japan .................. 3-054005

[51] Int. Cl.$^5$ ........................................... H01L 21/00
[52] U.S. Cl. .................. 156/662; 156/643; 156/646; 156/657
[58] Field of Search ............... 156/646, 662, 643, 657

[56] References Cited

U.S. PATENT DOCUMENTS 4,430,547 2/1984 Yonedo et al. ............... 156/643
4,975,340 12/1990 Suhr et al. ................... 156/643

FOREIGN PATENT DOCUMENTS 57-053939 3/1982 Japan .
61-220433 9/1986 Japan .
64-8628 1/1989 Japan .

OTHER PUBLICATIONS

"Plasma Etching of Silicon by Sulfur Hexafluoride"; Wagner et al.; Plasma Chem. Plasma Process., 1(2), abstract; 1981; Wagner et al.
"Disulfur dibromide, disulfur dichloride, and disulfur difluoride: halogen compounds for low-pressure plasma etching"; Electric Phenomena; 1989; Pons et al.

Primary Examiner—Brian E. Hearn
Assistant Examiner—George Goudreau
Attorney, Agent, or Firm—Hill, Van Santen, Steadman & Simpson

[57] ABSTRACT

A method for anisotropic etching of a layer of a silicon-based material, using an $SF_6$ gas, a versatile etching gas, is proposed. Sulfur (S) is used as a sidewall protection substance. This sulfur is not supplied into an etching reaction system on discharge dissociation of the etching gas, but is supplied by being sublimed off on heating from the inner wall surface of the etching chamber on which it is previously grown from a gaseous phase. Specifically, the $S_2F_2$ gas is introduced while a predetermined region of the inner wall surface of the etching chamber is cooled, and preliminary discharge is carried out to deposit sulfur on the region. A $SF_6$ containing etching gas is introduced into the chamber and the above mentioned region is heated for subliming S and simultaneously etching the layer of the silicon-based material. With this method, there is no necessity of using a specific etching gas capable of yielding free S in the plasma under discharge dissociating conditions. The present invention has an important significance as post-CFC (chlorofluorocarbon) gas measures. After end of etching, sulfur may be easily sublimed off by heating the wafer without the risk of pollution by particles.

5 Claims, 3 Drawing Sheets

DRY ETCHING METHOD BY SULFUR CONDITIONING

BACKGROUND OF THE INVENTION

1. Field of the Invention

This invention relates to a dry etching method employed in the preparation of semiconductor devices. More particularly, it relates to a method for low temperature anisotropic etching of a layer of a silicon-based material, such as a single crystal silicon, polysilicon or refractory metal silicide, at a mid to low temperature range without employing chlorofluorocarbon (CFC) based gases.

2. Description of the Related Art

In keeping up with the tendency towards a higher integration and a higher performance of semiconductor devices, as exemplified by VLSIs and ULSIs of recent origin, a strong demand is raised for a technique whereby requirements for high anisotropy, high etchrate and high selectivity may be unanimously met in the field of etching of a layer of a silicon based material, such as a single crystal silicon, a polysilicon, a refractory metal silicide or polycide.

A representative etching process for single crystal silicon is trench etching, that is processing for forming a trench with view to isolation of fine devices or procurement of a cell capacity area. Although it is required of this process to effect anisotropic etching with a pattern of a high aspect ratio, the cross-sectional profile of a trench tends to be changed intricately due to fluctuations in the mask pattern or changes in the etching conditions, so that unusual profiles such as undercuts or bowing are frequently encountered. These give rise to difficulties in trench filling and capacity control during the subsequent process.

On the other hand, a representative etching process for polysilicon or polycide is gate processing. The pattern width of the gate electrode directly affects the channel length of a transistor when its source/drain region is formed in a self-aligned manner or the dimensional accuracy of the sidewall in an LDD structure. Hence, extremely high processing accuracy is also required of this etching process.

Conventionally, CFC gases, exemplified by CFC113 ($C_2Cl_3F_3$), were used extensively as an etching gas for etching the silicon-based material. Since the CFC gases contain F and Cl in its molecule, etching may proceed in accordance with the radical reaction by radicals such as $F^*$ or $Cl^*$ and the ion assisted reaction by ions such as $CF_x^+$, $CCl_x^+$ or $Cl_x^+$, depending on conditions. High anisotropy may be achieved while there proceeds sidewall protection by a carbonaceous polymer deposited from a gaseous phase.

However, the CFC gas has been pointed out as causing destruction of an ozone layer of the earth and a ban will be placed on the production and application thereof in near future. Thus it is incumbent in the field of dry etching to find a substitute material for CFC gases and a method for using the material effectively. On the other hand, with further refinement of the design rule of the semiconductor devices in future, it may be feared that the carbonaceous polymer deposited from the gaseous phase will prove to be a source of pollution by particles. For this reason, post-CFC gas measures are strongly desired.

Among the techniques thought to be promising as post-CFC gas measures is a low-temperature etching, according to which the wafer temperature is maintained at a temperature not higher than 0° C. to maintain the etchrate along the depth at a practical level under the ion assisted effect while the radical reaction on the pattern sidewall is frozen or suppressed to prevent the occurrence of unusual shapes such as undercuts. In an Extended Abstracts of the 35th Spring Meeting (1988) of the Japan Society of Applied Physics and Related Societies, page 495, title number 28a-G-2, a report has been made of an example of cooling a wafer to −130° C. and effecting silicon trench etching and etching of an n+type polysilicon layer.

Meanwhile, if high anisotropy in low temperature etching is to be achieved solely by freezing or suppression of a radical reaction, cooling to a lower temperature lower than −100° C. is required so that it becomes mandatory to provide a cooling system for liquid nitrogen circulation in the etching system. This means that the hardware is increased in size and expensive, while it becomes difficult to maintain high reliability of O-rings or vacuum seals employed in a vacuum system under such low temperature. There is also presented a problem that the cooling time or the time necessary in resetting the wafer to room temperature is prolonged to lower the throughput. For this reason, for introducing low temperature etching into a mass-production process, it has been desired to develop a process which can be carried out at a low to mid temperature of −100° to 0° C. and preferably −70° to 0° C. which can be achieved by using a simpler cooling unit such as a chiller or a CFC based cooling medium, such as "Fluorinert" manufactured and sold by SUMITOMO 3A Co. Ltd. For realizing high anisotropic processing in such temperature range, it is thought to be a practical approach to combine the suppression of the radical reaction at a lower temperature and sidewall protection by deposits.

As such approach, the present inventor has previously proposed a technique which resides in low temperature etching of a layer of a silicon oxide based material at a temperature in the vicinity of −100° C. using sulfur fluorides such as $S_2F_2$ as an etching gas. This technique makes use of one of several sulfur fluoride gases which has an S/F ratio higher than that of well known $SF_6$, wherein the S/F ratio means a ratio of the S atoms to F atoms in a molecule. With this technique, the amount of the $F^*$ radicals in the etching system may be reduced while sulfur may be deposited on the pattern sidewall. That is, silicon selectivity may be improved by decreasing the amount of $F^*$ and the effects of sidewall protection may be achieved by S deposition. On the other hand, the temperature of achieving anisotropy may be drawn closer to room temperature than when $SF_6$ is used alone. Moreover, deposited S may be easily sublimed off by heating the wafer on completion of etching, so that there is no risk of pollution by particles.

The present Assignee has proposed a technique of low temperature etching of a polycide film at a temperature in the vicinity of −50° C. by a mixed gas containing sulfur fluoride having a high S/F ratio such as $S_2F_2$ and HBr. As for etching of the polycide film, unusual shape such as undercuts is frequently produced in the lower doped polysilicon layer which is susceptible to attack by radicals. However, with this technique, since both $SiBr_x$ and S contribute to sidewall protection, good shape anisotropy may be maintained by S deposition even if Br* (bromine radicals) were in excess during overetching.

The present inventor has also proposed in Digest of Papers, 1991 4th MicroProcess Conference, page 32, A-3-1, a technique of low temperature etching using a gas containing sulfur halides, such as $S_2Cl_2$ or $S_2Br_2$. This is aimed at employing a gas which is incapable of producing reactive F* for diminishing the effects of radicals.

It will be seen from the above that the techniques of effecting sidewall protection by S is highly promising because a clean process may be provided as long as etching of the layer of the silicon oxide based material is concerned.

However, many problems remain to be solved in applying the present technique to the etching of the layer of the silicon-based material, because the layer of the silicon-based material is highly susceptible to attack by radicals. Even with the use of the compound such as $S_2F_2$ having the highest S/F ratio among sulfur fluorides, F* are still in excess and unusual shapes such as undercuts are frequently produced under the mask. The effects of the reactive F* may be diminished by adding HBr to $S_2F_2$ as mentioned previously. However, addition of Br into the etching reaction system raises another problem. That is, if reaction products exhibiting low vapor pressure, such as $SiBr_x$ or $WBr_x$ as a result of etching of tungsten silicide, dimensional loss or pollution by particles may be feared to take place as a result of excess deposition of these reaction products. Similar problems are caused by using sulfur halides not producing F*.

As a problem inherent in the above mentioned techniques, the above sulfur halides, having the low S/X ratio, where X stands for a halogen atom, are not as yet mass-produced as dry etching gases. It is therefore desirable to use other less expensive commercially available gases.

OBJECT AND SUMMARY OF THE INVENTION

It is an object of the present invention to realize anisotropic etching of a silicon-based material by a more practically useful method, although based on low temperature etching for achieving sidewall protection by S.

That is, after sulfur is grown from a gaseous phase on at least a portion of the inner wall surface of an etching chamber, sulfur is sublimed off, and the layer of the silicon-based material is etched using the etching gas containing $SF_6$.

With the dry etching method of the present invention, an inexpensive proven compound $SF_6$ is used as a main etching gas for the layer of the silicon-based material. However, since $SF_6$ has the lowest S/F ratio among known sulfur fluorides, a larger number of F* radicals are yielded per molecule by discharge dissociation. Moreover, sidewall protection effects can not be expected of $SF_6$ because the atoms composing $SF_6$ are not completely dissociated by electrical discharge in one step reaction in the manner of $SF_6 \rightarrow S + 6F$ so that free S is not yielded in a plasma. It is therefore impossible to effect anisotropic etching of the layer of the silicon-based material by $SF_6$ alone in a mid to low temperature range when it is taken into consideration that such etching is difficult to achieve even by a compound having a high S/F ratio, such as $S_2F_2$. If anisotropic etching of the layer of the silicon-based material is to be effected at the mid to low temperature range with the use only of $SF_6$, it becomes necessary to effect cooling to a temperature as low as $-130°$ C.

According to the present invention, sulfur is previously grown from a gaseous phase on at least a part of the inner wall surface of an etching chamber before the start of etching. During etching, the inner wall surface is heated for subliming the sulfur for discharging the sulfur again into a gaseous phase. The sulfur thus yielded is adsorbed on the substrate surface if the substrate is cooled to a temperature substantially lower than room temperature. Although S deposited on the perpendicular ion incident surface is readily sputtered off, S deposited on the pattern sidewall which is not subject to perpendicular ion incidence will form a sidewall protection film. Thus, in accordance with the present method, the layer of the silicon-based material is etched at a high etchrate by F* derived from $SF_6$, while high anisotropy is achieved by S supplied from the inner wall surface of the etching chamber. Since the incident ion energy may be reduced in consideration of the effect sidewall protection, underlying layer selectivity and resist selectivity may be improved. Since the low to mid range temperature suffices for the wafer temperature, the device is not increased in size, while costs are not raised or throughput is not reduced markedly. Moreover, since S playing the role of sidewall protection may be easily sublimed off, there is no risk of pollution by particles.

The present invention is highly promising as post-CFC measures and has high utility in the preparation of semiconductor devices.

BRIEF DESCRIPTION OF THE DRAWINGS

FIGS. 1a and 1b are schematic cross-sectional views showing an example of arrangement and application of a magnetically-enhanced microwave plasma etching device used in the execution of the dry etching method of the present invention, wherein FIG. 1a shows the state of the application when sulfur is being grown from a gaseous phase, and FIG. 1b shows the state of the application during low temperature etching.

FIGS. 2a and 2b are schematic cross-sectional views showing a typical process in which the present invention is applied to gate processing, step by step, wherein FIG. 2a shows the state of a wafer before etching and FIG. 2b shows the state of an as-etched doped polysilicon layer.

FIGS. 3a and 3b are schematic cross-sectional views showing a typical process in which the present invention is applied to trench etching for isolation, step by step, wherein FIG. 3a shows the state of a wafer before etching and FIG. 3b shows the state on termination of trench etching.

DETAILED DESCRIPTION OF THE INVENTION

The present invention will be hereinafter explained in detail.

Before proceeding to description of an etching process, a typical construction of an etching device employed in executing the present invention and the manner of the operation thereof will be explained by referring to FIGS. 1a and 1b. Although the magnetically-enhanced microwave plasma etching device is explained as an example of the etching device, the manner of operation and improvements in the cooling system may be applied to a parallel flat plate type RIE (reactive ion etching device) or a magnetron RIE device as well.

Figure 1B:
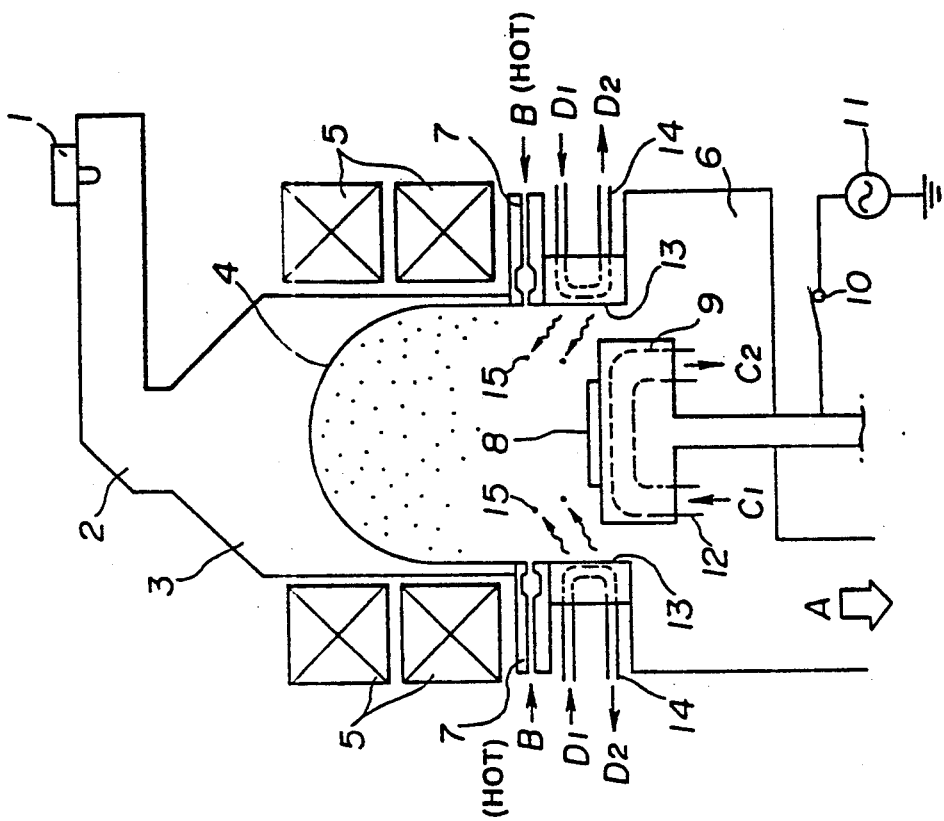
Figure 1A:
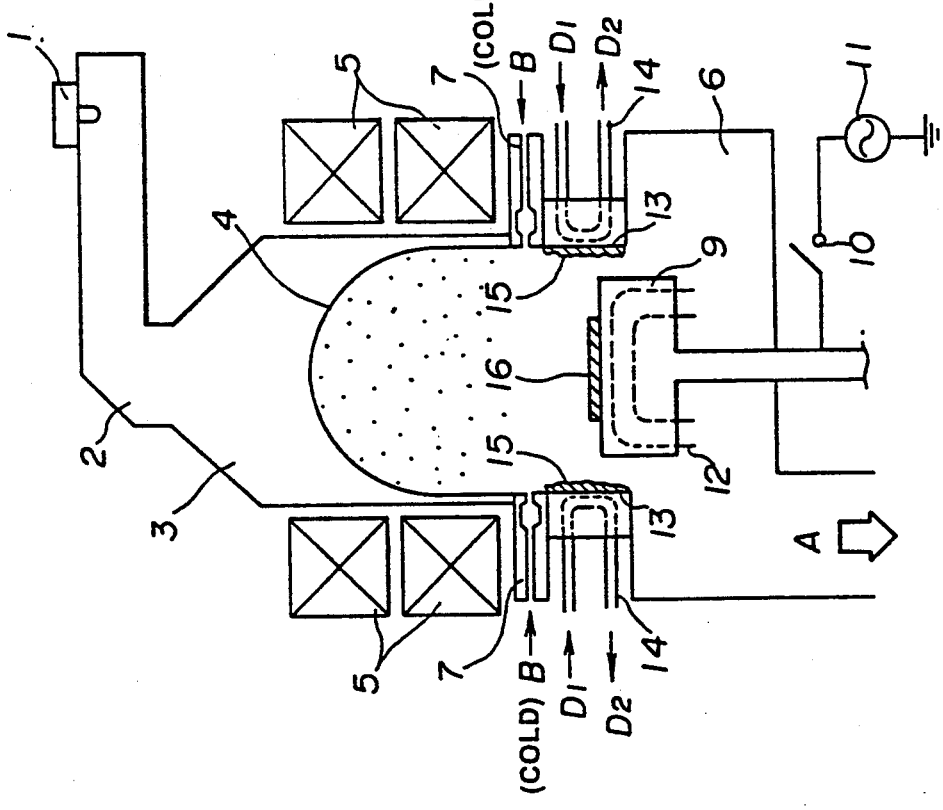

The arrangement of the etching device is shown in schematic cross-sectional views of FIGS. 1a and 1b. The etching device, adapted for performing various operations by utilizing a high density plasma generated by electron cyclotron resonance (ECR) discharge, includes a magnetron 1 for producing a microwave of 2.45 GHz, a rectangular waveguide 2 and a circular waveguide 3 transmitting the microwave, a quartz belljar 4 for generating plasma therein by ECR discharge by utilizing the microwave, a solenoid coil 5 provided around the circular waveguide 3 and the bell jar 4 and adapted for achieving a magnetic flux density of $8.75 \times 10^{-2}$ T (875 Gauss), a pre-chamber 6 connected to the bell jar 4 for load-lock and adapted to be evacuated to high vacuum in the direction shown by an arrow A, a gas inlet pipe 7 for supplying a gas necessary for processing from a direction shown by an arrow B into the bell jar 4, a wafer setting electrode 9 for setting a wafer 8 and an RF power source 11 connected to the wafer setting electrode 9 by a switch 10 for applying an RF bias to the wafer setting electrode 9.

In the above described customary construction of the magnetically-enhanced microwave plasma etching device, a cooling piping 12 is embedded in the apparatus of the present invention in the wafer setting electrode 9 for providing for low temperature etching. In this cooling piping 12, the cooling medium is introduced from a chiller, not shown, provided outside the apparatus, for circulation in the directions shown by arrows $C_1$ and $C_2$.

A temperature conditioning sidewall 13 is provided in a part of the sidewall of the bell jar 4 surrounding the wafer setting electrode 9 for providing for deposition and sublimation of sulfur 15. A temperature conditioning piping 14 is enclosed in the temperature conditioning sidewall 13 and, by circulating the heat conducting medium from a temperature conditioning system, not shown, to the temperature conditioning piping 14 in the direction shown by arrows $D_1$, $D_2$, the temperature conditioning sidewall 13 may be cooled or heated to a desired temperature.

Meanwhile, it is customary in the magnetically-enhanced microwave plasma etching device to provide a water cooling system, not shown, for encircling at least a part of the bell jar 4 for preventing overheating of the bell jar 4 by the plasma radiant heat. However, it is not possible with the cooling capacity of the ordinary water-cooling system to allow the sulfur to be deposited on at least a part of the inner wall of the bell jar 4 because it is then necessary to cool such part to lower than room temperature. For this reason, the above mentioned temperature conditioning system is provided independently of the conventional water cooling system.

The manner of the operation of the magnetically-enhanced microwave plasma etching device is explained hereinbelow.

When it is desired to deposit sulfur (S) on the surface of the temperature conditioning sidewall 13, the cooling medium is circulated in the temperature conditioning piping 14, as shown in FIG. 1a. A gas capable of yielding S into a plasma on discharge dissociation is introduced from the gas inlet pipe 7 into the bell jar 4 for microwave discharge. In the context of the present specification, the discharge for sulfur deposition is termed preliminary discharge. At this time, a dummy wafer 16 irrelevant to etching is set on the wafer setting electrode 9. The dummy wafer 16 plays the role of preventing S deposition on the wafer setting electrode 9 to prevent the cooling efficiency of the wafer 8 from being lowered during the subsequent etching process, as well as the role of stabilizing the state of the plasma. The supply of the cooling medium into the cooling pipe 12 is halted for raising the temperature of the dummy wafer 16 by plasma radiant heat to prevent S deposition to raise the S deposition efficiency. Since preliminary discharge is not aimed at etching, it is unnecessary to apply a bias voltage to the wafer setting electrode 9.

For etching, the wafer 8 is set on the wafer setting electrode 9 and the cooling medium is circulated through cooling piping 12 for cooling to a desired temperature. For subliming S deposited on the surface of the temperature conditioning sidewall 13, supply of the cooling medium to the piping 14 is halted to raise the temperature of the temperature conditioning sidewall 13, or the heating medium is circulated for positive heating. In this state, an etching gas containing $SF_6$ is supplied into the bell jar 4 from the gas inlet pipe 7 to effect microwave discharge to cause etching of the silicon based material layer by the $SF_6$ and sidewall protection by S to proceed simultaneously on the wafer 8 to achieve high anisotropic etching at a mid to low temperature range.

PREFERRED EMBODIMENTS

Typical processes employing the above described magnetically-enhanced microwave plasma etching device will be explained hereinbelow.

EXAMPLE 1

In the present Example 1, the present invention is applied to gate processing in which, after preliminary discharge with continued supply of $S_2F_2$, a doped polysilicon layer is etched using $SF_6$.

As shown in FIG. 1a, the dummy wafer 16 was set on the wafer setting electrode 9. As such dummy wafer 16, a silicon wafer on which no particular pattern has been formed, may be employed. Ethanol was supplied to the temperature conditioning piping 14 from an exterior temperature conditioning system for cooling the temperature conditioning sidewall 13 to about $-40°$ C. The switch 10 was turned off so that the RF bias was not applied. Under this state, the $S_2F_2$ gas was supplied from gas inlet pipe 7 into the bell jar 4 at a flow rate of 50 SCCM and preliminary discharge was effected under conditions of a gas pressure of 1.3 Pa (10 mTorr) and a microwave power of 850 W. As a result, sulfur (S) was deposited on the surface of the temperature conditioning sidewall 13.

Figure 2A:
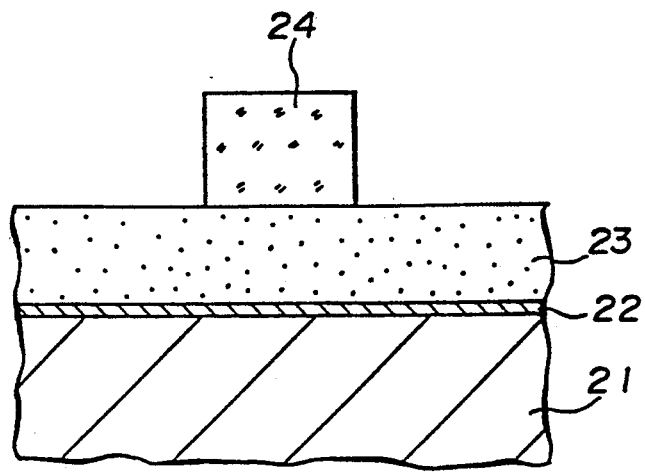

Then, as shown in FIG. 1b, the wafer 8 was set on the wafer setting electrode 9 and ethanol was circulated through the cooling piping 12 from an exterior chiller for cooling to about $-40°$ C. The wafer 8 at this time is as shown in FIG. 2a, in which an n+doped polysilicon layer 23 is deposited on the silicon substrate 21 via a gate oxide film 22, and a resist pattern 24 of a predetermined contour is formed as an etching mask on the doped polysilicon layer 23. The ethanol cooling medium ceased to be supplied to the temperature conditioning piping 14 and, in its stead, hot water maintained at about $90°$ C. was circulated. The switch 10 was turned on to connect the RF power source 11 to the wafer setting electrode 9. Under this state, a $SF_6$ gas was supplied from the gas inlet pipe 7 into the bell jar 4 at a gas flow rate of 10 SCCM and the doped polysilicon layer 23 was etched under conditions of a gas pressure of 1.3 Pa (10 mTorr), a microwave power of 850 W and an RF bias power of 30 W (2 MHz).

Figure 2B:
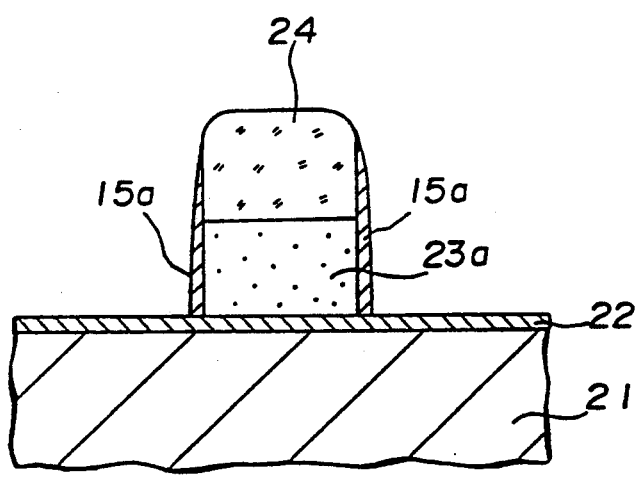

Etching proceeded with F* derived on dissociation from $SF_6$ by microwave discharge, as a main etchant. The apparent S/F ratio in the etching system was increased by S being supplied from the surface of the heated temperature conditioning sidewall 13, so that S was deposited on the pattern sidewall on the wafer 8 to yield a sidewall protection film 15a. Under the above conditions, radical reactions were suppressed to some extent by cooling the wafer 8 to a lower temperature. In this manner, a gate electrode 23a having good shape anisotropy could be formed without producing undercuts etc. below the resist pattern despite cooling to a temperature of the order of −40° C., as shown in FIG. 2b. The sidewall protection film 15a could be easily sublimed off on heating the wafer 8 after the end of etching without causing pollution by particles.

Meanwhile, high selectivity of the gate oxide film 22 could be achieved in the above process simultaneously. The main reason is that the radical reaction is suppressed by the lower wafer temperature and the RF power may be diminished in consideration of sidewall protection. When calculated as $V_{dc}$, the RF bias power is not more than 20 V, which is extremely low as an ion incident energy. The above process is highly effective in view of the recent tendency towards thinner gate oxide films. Since the resist pattern 24 is sputtered off in a limited amount under the above mentioned low bias condition, resist selectivity may be improved, while pollution by particles by the carbonaceous polymer is prevented.

EXAMPLE 2

In the present Example 2, the present invention is applied to trench etching for isolation and, after preliminary discharge under $S_2F_2$, the silicon substrate was etched using $SF_6$.

Preliminary discharge was effected in the same way as in Example 1 for depositing sulfur (A) on the surface of the temperature conditioning sidewall 13.

Figure 3A:
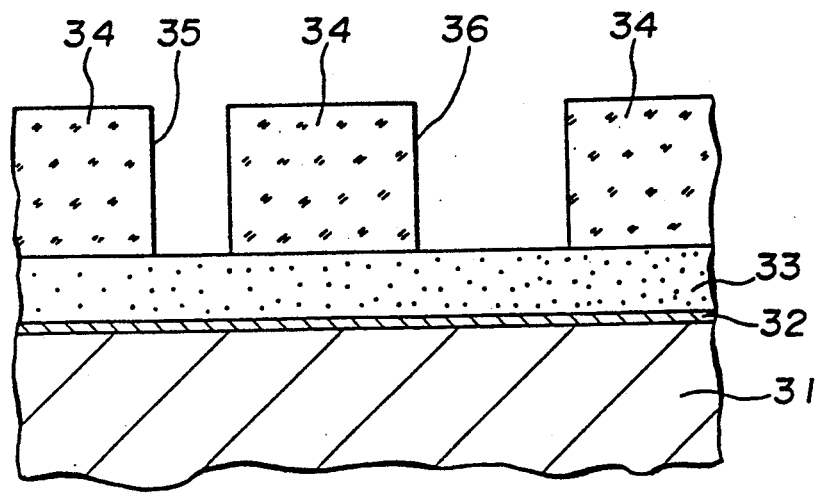

The wafer 8 was set on the wafer setting electrode 9 and ethanol was circulated through the cooling piping 12 from an exterior chiller for cooling to about −60° C. The wafer 8 at this time is as shown in FIG. 3a, in which a silicon oxide layer of a thickness of the order of 0.01 μm and a polysilicon layer 33 of a thickness of a order of 0.01 μm were deposited on the silicon substrate 31, and a resist pattern 34 of a predetermined contour was formed as an etching mask on the polysilicon layer 33. Meanwhile, the polysilicon layer 33 is provided as a buffer layer whereby edge recession of the resist pattern 34 during etching does not lead to deterioration of the cross-sectional profile of the trench, while the silicon oxide layer 32 is provided as a stop for removal by etchback of the polysilicon layer 33 after the end of trench etching. The resist pattern 34 is provided with an opening having an opening width of 0.5 μm and a second opening 36 having an opening width of 1 μm. The temperature conditioning sidewall 13 was heated in the same manner as in Example 1. The $SF_6$ gas was supplied from the gas inlet piping 7 into the bell jar 4 at a flow rate of 30 SCCM and trench etching was effected under conditions of a gas pressure of 1.3 Pa (10 mTorr), a microwave power of 850 W and an RF bias power of 150 W (2 MHz).

Figure 3B:
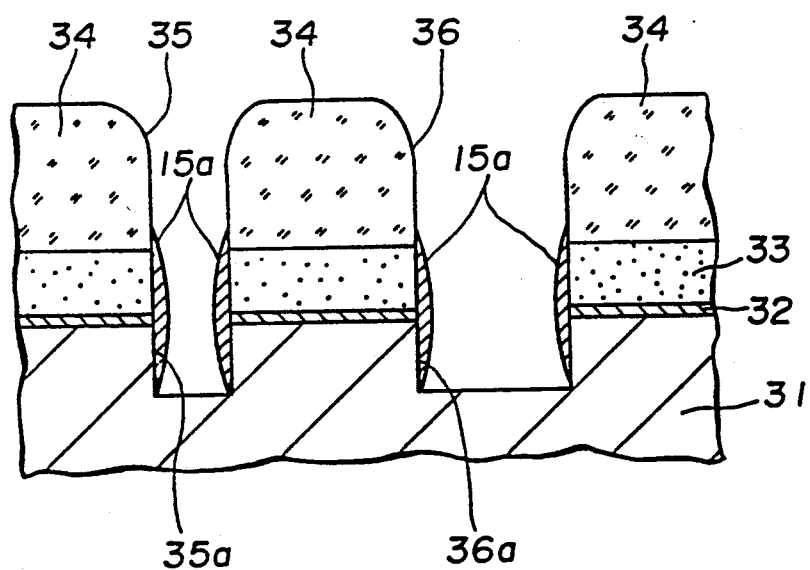

During this process, etching proceeded at a high rate by the ion assisted reaction by ions such as $SF_x^+$ and by the radical reaction by F*, which proceeded simultaneously, while sulfur (S) sublimed from the surface of the temperature conditioning sidewall 13 was deposited on the pattern sidewall for forming a sidewall protection film 15a. As a result thereof, trenches 35a, 36a having the depth of the order of 0.5 μm were formed with high shape anisotropy, as shown in FIG. 3b.

Meanwhile, if a plurality of openings with different widths are present on the wafer, the incident efficiency of active species becomes higher in the second opening 36 than in the first opening 35 with a narrower width than that of the first opening 35, so that the trenches tends to have different depths. This phenomenon is frequently observed as micro-leading effects in the conventional dry etching technique. However, with the present invention, more sulfur (S) is adsorbed on the bottom of the second opening 36 having the broad width, rather than in the first opening 35, and the adsorption process is produced competitively with the sputtering removal process, so that the etching reaction is moderately suppressed in the second opening 36. The result is the reduced difference in the etchrates in the openings 35 and 36 and the suppressed micro-loading effects.

Although the present invention has been explained with reference to two illustrative embodiments, the present invention is not limited to these embodiments. For example, as the compounds employed for preliminary discharge, $SF_2$, $SF_4$, $S_2F_{10}$, $S_3Cl_2$, $S_2Cl_2$, $SCl_2$, $S_3Br_2$, $S_2Br_2$ and $SBr_2$, may be used as compounds employed for preliminary discharge, besides $S_2F_2$ mentioned above. If $H_2$, $H_2S$ or silane-based compounds are added to these compounds, H* or Si* capture halogen radicals to raise the apparent S/X ratio of the mixed gas to promote sulfur deposition.

Heating and cooling of the temperature conditioning sidewall 13 may be by e.g. a Peltier element, instead of by the system of circulating the heat-transmitting medium, as mentioned above. Heating may also be by an electric heater.

Inert gases such as $N_2$ may be added to $SF_6$ employed for etching the layer of the silicon-based material for controlling the etchrate and augmenting sidewall protection effects. Rare gases such as He or Ar may also be employed in expectation of sputtering, diluting and cooling effects.

What is claimed is:

1. A dry etching method comprising the steps of
   growing sulfur from a gaseous phase on at least a part of the inner wall surface of an etching chamber, and
   etching a layer of a silicon-based material on a wafer using an $SF_6$ containing etching gas during sublimation of said sulfur.

2. A dry etching method as claimed in claim 1 wherein said sulfur is grown from a gaseous phase by preliminary discharge using a source gas containing at least one sulfur halide selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$ and $SBr_2$.

3. A dry etching method as claimed in claim 1 wherein at least a part of the inner wall surface of the etching chamber on which sulfur is grown from a gaseous phase is cooled and heated during growth of sulfur from the gaseous phase and during sulfur sublimation, respectively.

4. A dry etching method as claimed in claim 1 wherein the layer of the silicon-based material is etched while the wafer temperature is controlled to −100° C. to room temperature.

5. A dry etching method as claimed in claim 1 wherein the layer of the silicon-based material is formed of one of single crystal silicon, polysilicon, refractory metal silicide or polycide.

* * * * *